United States Patent
Umeda et al.

(10) Patent No.: US 12,166,159 B2
(45) Date of Patent: Dec. 10, 2024

(54) SEMICONDUCTOR NANOPARTICLE AGGREGATE, SEMICONDUCTOR NANOPARTICLE AGGREGATE DISPERSION LIQUID, SEMICONDUCTOR NANOPARTICLE AGGREGATE COMPOSITION, AND SEMICONDUCTOR NANOPARTICLE AGGREGATE CURED FILM

(71) Applicant: SHOEI CHEMICAL INC., Tokyo (JP)

(72) Inventors: Naoki Umeda, Tosu (JP); Makoto Kido, Tosu (JP); Yuko Mitsuka, Tosu (JP); Hirokazu Sasaki, Tosu (JP)

(73) Assignee: Shoei Chemical Inc., Tokyo (JP)

( * ) Notice: Subject to any disclaimer, the term of this patent is extended or adjusted under 35 U.S.C. 154(b) by 0 days.

(21) Appl. No.: 17/757,103

(22) PCT Filed: Dec. 4, 2020

(86) PCT No.: PCT/JP2020/045282
§ 371 (c)(1),
(2) Date: Jun. 9, 2022

(87) PCT Pub. No.: WO2021/124934
PCT Pub. Date: Jun. 24, 2021

(65) Prior Publication Data
US 2024/0222574 A1    Jul. 4, 2024

(30) Foreign Application Priority Data

Dec. 17, 2019 (JP) .................. 2019-227245

(51) Int. Cl.
| | | |
|---|---|---|
| H01L 33/50 | (2010.01) | |
| B82Y 20/00 | (2011.01) | |
| B82Y 40/00 | (2011.01) | |
| C08K 9/02 | (2006.01) | |
| C09K 11/02 | (2006.01) | |
| C09K 11/08 | (2006.01) | |
| C09K 11/70 | (2006.01) | |
| C09K 11/88 | (2006.01) | |

(52) U.S. Cl.
CPC .............. *H01L 33/504* (2013.01); *C08K 9/02* (2013.01); *C09K 11/025* (2013.01); *C09K 11/0883* (2013.01); *C09K 11/70* (2013.01); *C09K 11/883* (2013.01); *B82Y 20/00* (2013.01); *B82Y 40/00* (2013.01); *C08K 2201/011* (2013.01)

(58) Field of Classification Search
CPC . C09K 11/025; C09K 11/0883; C09K 11/883; C09K 11/70
See application file for complete search history.

(56) References Cited

U.S. PATENT DOCUMENTS

| | | | |
|---|---|---|---|
| 9,169,435 B2 | 10/2015 | Guo et al. | |
| 9,884,993 B2 | 2/2018 | Guo et al. | |
| 2015/0083969 A1 | 3/2015 | Kim et al. | |
| 2017/0306227 A1 | 10/2017 | Ippen et al. | |
| 2018/0301592 A1 | 10/2018 | Peng et al. | |
| 2023/0028095 A1* | 1/2023 | Umeda | B82Y 20/00 |

FOREIGN PATENT DOCUMENTS

| | | | |
|---|---|---|---|
| JP | 2018533658 A | | 11/2018 |
| WO | 2017086362 A1 | | 5/2017 |
| WO | WO 2017/086362 | * | 5/2017 |
| WO | 2019039305 A1 | | 2/2019 |
| WO | 2019131402 A1 | | 7/2019 |

OTHER PUBLICATIONS

Tanslation for WO 2017/096362, May 26, 2017.*
China National Intellectual Property Administration, Office Action Issued in Application No. 202080067625.3, Mar. 7, 2024, 12 pages.

* cited by examiner

*Primary Examiner* — C Melissa Koslow
(74) *Attorney, Agent, or Firm* — Alleman Hall & Tuttle LLP

(57) ABSTRACT

A semiconductor nanoparticle aggregate that is an aggregate of core/shell type semiconductor nanoparticles including a core including In and P and a shell having one or more layers, in which a peak wavelength of an emission spectrum of the semiconductor nanoparticle aggregate is from 605 nm to 655 nm and a full width at half maximum of the emission spectrum is 43 nm or less. For each semiconductor nanoparticle, (1) an average value of a full width at half maximum of an emission spectrum is 28 nm or less, (2) a standard deviation of a peak wavelength of the emission spectrum is 10 nm or more and 30 nm or less, and (3) a standard deviation of the full width at half maximum of the emission spectrum is 12 nm or less.

12 Claims, 2 Drawing Sheets

SEMICONDUCTOR NANOPARTICLE AGGREGATE, SEMICONDUCTOR NANOPARTICLE AGGREGATE DISPERSION LIQUID, SEMICONDUCTOR NANOPARTICLE AGGREGATE COMPOSITION, AND SEMICONDUCTOR NANOPARTICLE AGGREGATE CURED FILM

TECHNICAL FIELD

The present invention relates to a semiconductor nanoparticle aggregate and a semiconductor nanoparticle aggregate dispersion liquid, a semiconductor nanoparticle aggregate composition, and a semiconductor nanoparticle aggregate cured film including the semiconductor nanoparticle aggregate.

BACKGROUND ART

Semiconductor nanoparticles having a microscopic particle diameter (Quantum Dots: QD) are used as wavelength conversion materials for displays. Such semiconductor nanoparticles are microscopic particles that may exhibit a quantum confinement effect and the width of the band gap varies depending on the size of the nanoparticles. Excitons formed in the semiconductor particles by means such as photoexcitation and charge injection emit photons having energy depending on the band gap by recombination. Therefore, the emission wavelength can be controlled by adjusting the crystal size of the semiconductor nanoparticles and thus light emission of a desired wavelength can be obtained.

As QD devices using semiconductor nanoparticles, there are QD devices made by a method for whitening blue light by a QD film obtained by forming the aggregate of the semiconductor nanoparticles into a film, and converting the obtained white light into red, green, and blue through a color filter (a QD film method) and QD devices made by a method of directly converting blue light into red and green by a QD color filter using the aggregate of the semiconductor nanoparticles (a QD color filter method).

One example of the device configuration of the QD device using the QD color filter method will be described with reference to FIG. 1. As illustrated in FIG. 1, QD patterns (7 and 8) are used to directly convert blue light into red light or blue light into green light without converting the blue light from a blue LED 1 serving as a light source into white light. The QD patterns (7 and 8) are formed by patterning the aggregate of the semiconductor nanoparticles dispersed in a resin and the thickness thereof is from about 5 to 10 μm due to the structural limitation of the display. With respect to blue, blue light from the blue LED 1 serving as a light source transmitted through a diffusion layer 9 including a diffusing material is used. Reference sign 3 is a liquid crystal and a polarizing plate is omitted in FIG. 1.

One example of the device configuration of the QD device using the QD film method will be described with reference to FIG. 2. As illustrated in FIG. 2, a blue LED 101 is used as a light source. First, the blue light is converted into white light. For the conversion from blue light to white light, a QD film 102 made by dispersing the aggregate of the semiconductor nanoparticles in a resin to form a film having a thickness of about 100 μm is suitably used. The white light obtained by the wavelength conversion layer such as the QD film 102 is further converted into red light, green light, and the blue light with a color filter (R) 104, a color filter (G) 105, and a color filter (B) 106, respectively. Reference sign 103 is a liquid crystal and a polarizing plate is omitted in FIG. 2.

Of these methods, the QD color filter method directly converts the blue light into each color and thus the wavelength conversion efficiency of the entire QD device is high. Therefore, in recent years, the QD color filter method has attracted attention.

Under such background, the semiconductor nanoparticles are originally required to have a high quantum yield in order to increase the wavelength conversion efficiency of the QD device and to have a narrow full width at half maximum in order to prevent color mixing.

As the semiconductor nanoparticles, Cd chalcogenide semiconductor nanoparticles and semiconductor nanoparticles using InP as a base material have been known (for example, Patent Literatures 1 to 3). Conventionally, a lot of research has been conducted on Cd-based semiconductor nanoparticles. This is because the Cd-based semiconductor nanoparticles have a high quantum yield and in addition change in the emission wavelength caused by varying the particle diameter is relatively gentle and thus the emission wavelength can be easily controlled.

In recent years, however, the development of non-Cd-based semiconductor nanoparticles has been desired in consideration of adverse effects on the environment and the human body. Examples of the non-Cd-based semiconductor nanoparticles include semiconductor nanoparticles using InP as the base material. The InP-based semiconductor nanoparticles using InP as the base material, however, have a lower quantum yield than that of the Cd-based semiconductor nanoparticles and the change in emission wavelength caused by varying the particle diameter is large, and thus a problem of difficulty in the control of the emission wavelength arises.

Therefore, the following attempts have been made as the InP-based semiconductor nanoparticles. For example, Patent Literature 4 has disclosed semiconductor nanoparticles having a core-shell structure (hereinafter, also referred to as an InP/ZnSe·ZnS core/shell structure) formed of a core made of InP and a shell made of ZnSe and ZnS and attempts have been made to improve absorbance. Patent Literature 1 has disclosed semiconductor nanoparticles in which an InP/ZnSe·ZnS core/shell structure includes a halogen and attempts have been made to improve a quantum yield. Patent Literature 5 has disclosed semiconductor nanoparticles having a core-shell structure (hereinafter, also referred to as an InP/ZnSe·ZnS core/shell structure) formed of a core made of InP and a shell made of ZnSe and ZnS and attempts have been made to improve the quantum yield and to narrow the full width at half maximum.

CITATION LIST

Patent Literature

Patent Literature 1: U.S. Patent Application Laid-open No. 2015/083969
Patent Literature 2: U.S. Pat. No. 9,169,435
Patent Literature 3: U.S. Pat. No. 9,884,993
Patent Literature 4: U.S. Patent Application Laid-open No. 2017/0306227
Patent Literature 5: U.S. Patent Application Laid-open No. 2018/0301592

SUMMARY OF INVENTION

Technical Problem

In Cited Literatures 1, 4 and 5 of the conventional examples, attempts have been made to narrow the full width at half maximum and to improve the quantum yield. However, the requirements for properties with respect to the quantum yield and the full width at half maximum of the semiconductor nanoparticles are high and further improvement is required. When an attempt is made to improve the quantum yield, however, the full width at half maximum is widened and when an attempt is made to narrow the full width at half maximum, the quantum yield is lowered. Satisfying both of these properties is difficult to achieve, and thus the conventional InP-based semiconductor nanoparticles are difficult to satisfy the properties required by the market.

In view of this, an object of the present invention is to provide an aggregate of core/shell type semiconductor nanoparticles made of a core including In and P and a shell having one or more layers that can satisfy both a high quantum yield and a narrow full width at half maximum.

Solution to Problem

As a result of intensive study for solving the above-described problems, the inventors of the present invention have found that in semiconductor nanoparticles having a core/shell type structure made of a core including In and P and a shell having one or more layers, in addition to the full width at half maximum of the emission spectrum ($\lambda^1$) of the entire aggregate of the semiconductor nanoparticles, the average value of the full width at half maximum (FWHM$^2$) of the emission spectrum ($\lambda^2$) from each particle obtained by exciting the semiconductor nanoparticles constituting the semiconductor nanoparticle aggregate with excitation light of 445 nm, the standard deviation (SD$^1$) of the peak wavelength ($\lambda^2_{MAX}$), and the standard deviation (SD$^2$) of the full width at half maximum (FWHM$^2$) affect the quantum yield of the semiconductor nanoparticles, and further have found that a semiconductor nanoparticle aggregate that satisfies both a high quantum yield and a narrow full width at half maximum and sufficiently satisfies the properties required by the market can be obtained by setting the average value of the full width at half maximum (FWHM$^2$), the standard deviation (SD$^1$) of the peak wavelength ($\lambda^2_{MAX}$), and the standard deviation (SD$^2$) of the full width at half maximum (FWHM$^2$) to specific ranges. Consequently, the present invention has been attained.

Specifically, the present invention (1) provides a semiconductor nanoparticle aggregate that is an aggregate of core/shell type semiconductor nanoparticles including a core including In and P and a shell having one or more layers, in which a peak wavelength ($\lambda^1_{MAX}$) of an emission spectrum ($\lambda^1$) when the semiconductor nanoparticle aggregate is excited with excitation light of 450 nm in a state where the semiconductor nanoparticle aggregate is dispersed in a dispersion medium is from 605 nm to 655 nm and a full width at half maximum (FWHM$^1$) of the emission spectrum ($\lambda^1$) is 43 nm or less, an emission spectrum ($\lambda^2$) from each particle obtained by exciting the semiconductor nanoparticles constituting the semiconductor nanoparticle aggregate with excitation light of 445 nm satisfies all of the following requirements (1) to (3):

(1) an average value of a full width at half maximum (FWHM$^2$) of the emission spectrum ($\lambda^2$) is 28 nm or less, (2) a standard deviation (SD$^1$) of a peak wavelength ($\lambda^2_{MAX}$) of the emission spectrum ($\lambda^2$) is 10 nm or more and 30 nm or less, and (3) a standard deviation (SD$^2$) of the full width at half maximum (FWHM$^2$) of the emission spectrum ($\lambda^2$) is 12 nm or less.

The present invention (2) provides the semiconductor nanoparticle aggregate according to (1), in which the full width at half maximum (FWHM$^1$) is 38 nm or less.

The present invention (3) provides the semiconductor nanoparticle aggregate according to (1) or (2), in which the average value of the full width at half maximum (FWHM$^2$) is 25 nm or less.

The present invention (4) provides the semiconductor nanoparticle aggregate according to any one of (1) to (3), in which the standard deviation (SD$^2$) is 7 nm or less.

The present invention (5) provides the semiconductor nanoparticle aggregate according to any one of (1) to (4), in which the full width at half maximum (FWHM$^1$) is 35 nm or less, the average value of the full width at half maximum (FWHM$^2$) is 24 nm or less, and the standard deviation (SD$^2$) is 6 nm or less.

The present invention (6) provides the semiconductor nanoparticle aggregate according to any one of (1) to (5), in which a quantum yield (QY) of the semiconductor nanoparticle aggregate is 80% or more.

The present invention (7) provides the semiconductor nanoparticle aggregate according to (6), in which the quantum yield (QY) of the semiconductor nanoparticle aggregate is 85% or more.

The present invention (8) provides the semiconductor nanoparticle aggregate according to (7), in which the quantum yield (QY) of the semiconductor nanoparticle aggregate is 90% or more.

The present invention (9) provides the semiconductor nanoparticle aggregate according to any one of (1) to (8), in which the semiconductor nanoparticles include at least In, P, Zn, Se, and halogen, and in the semiconductor nanoparticles, molar ratios of P, Zn, Se, and halogen relative to In in terms of atoms are P: 0.20 to 0.95, Zn: 11.00 to 50.00, Se: 7.00 to 25.00, and halogen: 0.80 to 15.00.

The present invention (10) provides a semiconductor nanoparticle aggregate dispersion liquid, including the semiconductor nanoparticle aggregate as described in any one of (1) to (9) dispersed in an organic dispersion medium.

The present invention (11) provides a semiconductor nanoparticle aggregate composition, including the semiconductor nanoparticle aggregate as described in any one of (1) to (9) dispersed in a monomer or a prepolymer.

The present invention (12) provides a semiconductor nanoparticle aggregate cured film, including the semiconductor nanoparticle aggregate as described in any one of (1) to (9) dispersed in a macromolecule matrix.

Advantageous Effects of Invention

According to the present invention, the aggregate of the core/shell type semiconductor nanoparticles made of the core including In and P and the shell having one or more layers that satisfies both a high quantum yield and a narrow full width at half maximum and has excellent properties can be provided.

DESCRIPTION OF EMBODIMENTS

Figure 1:
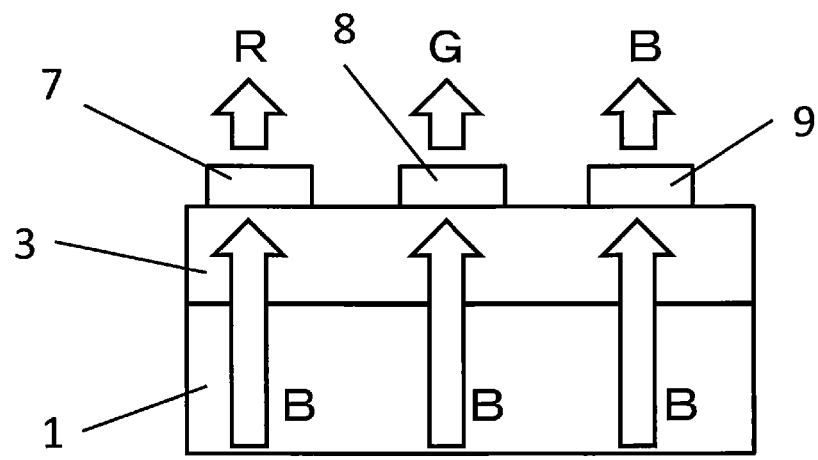
FIG. 1 is a schematic view illustrating a QD device.
Figure 2:
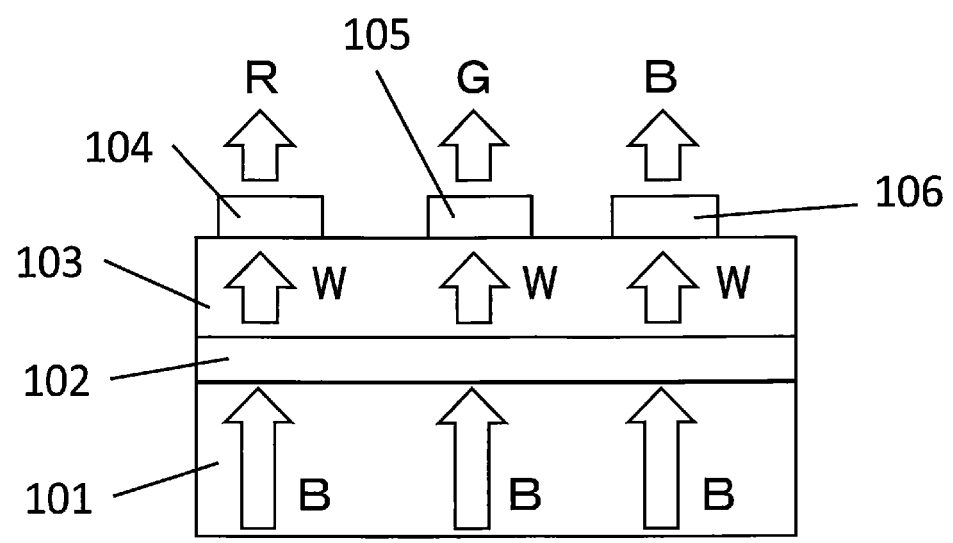
FIG. 2 is a schematic view illustrating a QD device.

The semiconductor nanoparticle aggregate according to the present invention is a semiconductor nanoparticle aggregate that is an aggregate of core/shell type semiconductor nanoparticles having a core including In and P and a shell having one or more layers, in which
a peak wavelength ($\lambda^1_{MAX}$) of an emission spectrum ($\lambda^1$) when the semiconductor nanoparticle aggregate is excited with excitation light of 450 nm in a state where the semiconductor nanoparticle aggregate is dispersed in a dispersion medium is from 605 to 655 nm and a full width at half maximum (FWHM$^1$) of the emission spectrum ($\lambda^1$) is 43 nm or less, and
an emission spectrum ($\lambda^2$) from each particle obtained by exciting the semiconductor nanoparticles constituting the semiconductor nanoparticle aggregate with excitation light of 445 nm satisfies all of the following requirements (1) to (3):
(1) an average value of a full width at half maximum (FWHM$^2$) of the emission spectrum ($\lambda^2$) is 28 nm or less,
(2) a standard deviation (SD$^1$) of a peak wavelength ($\lambda^2_{MAX}$) of the emission spectrum ($\lambda^2$) is 10 nm or more and 30 nm or less, and
(3) a standard deviation (SD$^2$) of the full width at half maximum (FWHM$^2$) of the emission spectrum ($\lambda^2$) is 12 nm or less.

Hereinafter, the term " ... to ... " indicating a value range represents a range including the values presented before and after the term "to" unless otherwise specified. Namely, A to B refers to A or more and B or less.
(Semiconductor Nanoparticles)

The semiconductor nanoparticles constituting the semiconductor nanoparticle aggregate according to the present invention are the core/shell type semiconductor nanoparticles having the core including In and P and the shell having one or more layers. In the semiconductor nanoparticles, the shell may have at least one layer. Examples of the semiconductor nanoparticles include the core/shell type semiconductor nanoparticles including the core and the shell having one layer, core/shell type semiconductor nanoparticles including the core and the shell having two layers, and core/shell type semiconductor nanoparticles including the core and the shell having three or more layers. In particular, the shell made of two or more layers allows the fluorescence quantum yield of the semiconductor nanoparticles to be retained and the semiconductor nanoparticle aggregate to have a high fluorescence quantum yield. As the structure of the semiconductor nanoparticles, the shell may cover at least a part of the surface of the core. A structure in which the shell covers the entire surface of the core is preferable and a structure in which the shell uniformly covers the entire surface of the core is particularly preferable.

The shell preferably includes a shell having a composition including Zn and Se and at least one of the layers of the shell is preferably formed of ZnSe. In the case where the semiconductor nanoparticles have the shell having two or more layers, the outermost layer is preferably a shell having a composition including Zn and S and further preferably ZnS.

In particular, in the case where the shell is made of a first shell that is formed of at least ZnSe and covers the outer surface of the core particle and a second shell that is formed of ZnS and covers the outer surface of the first shell, the fluorescence quantum yield can be increased.

As long as the effect of the present invention is not impaired, the composition in the shell does not necessarily have to be a stoichiometric composition. Elements other than Zn, Se, and S may be included in each shell, or the shell may have one or more gradient-type layers in which the ratio of elements constituting the shell changes.

Here, in the present invention, whether the shell covers at least a part of the core and the element distribution inside the shell can be confirmed by, for example, using energy dispersive X-ray spectroscopy using a transmission electron microscope (TEM-EDX) to study the composition analysis.

The semiconductor nanoparticles constituting the semiconductor nanoparticle aggregate according to the present invention can include halogen. In the case where the semiconductor nanoparticles include halogen, the molar ratio of the halogen to In in the semiconductor nanoparticles is preferably from 0.80 to 15.00 and particularly preferably from 1.00 to 15.00 in terms of atoms. The halogen included in the semiconductor nanoparticles is preferably F, Cl, or Br. Including the halogen in the semiconductor nanoparticles in the above-described range allows a high fluorescence quantum yield and a narrow full width at half maximum to be obtained. The halogen exists at the interface between the core and the shell of the semiconductor nanoparticles and/or in the shell of the semiconductor nanoparticles, whereby the above-described effects can be further achieved.

The elements constituting the semiconductor nanoparticles can be analyzed by using a high frequency inductively coupled plasma emission spectrometer (ICP) or an X-ray fluorescence analyzer (XRF).

In the case where the semiconductor nanoparticles constituting the semiconductor nanoparticle aggregate according to the present invention is constituted of semiconductor nanoparticles in which at least In, P, Zn, Se, and halogen are included and the molar ratios of P, Zn, Se, and halogen relative to In in terms of atoms are P: 0.20 to 0.95, Zn: 11.00 to 50.00, Se: 7.00 to 25.00, and halogen: 0.80 to 15.00 and preferably 1.00 to 15.00, a high quantum yield is easily achieved and thus this constitution is preferable.

The Cd content of the semiconductor nanoparticles constituting the semiconductor nanoparticle aggregate according to the present invention is 100 ppm by mass or less, preferably 80 ppm by mass or less, and particularly preferably 50 ppm by mass or less.

An example of a method for producing the semiconductor nanoparticles will be disclosed below.

The core of the semiconductor nanoparticles can be formed by mixing a precursor of In, a precursor of P, and, if necessary, additives in a solvent and heating the obtained precursor mixture liquid. As the solvent, a coordinating solvent or a non-coordinating solvent is used.

Examples of the solvent include 1-octadecene, hexadecane, squalane, oleylamine, trioctylphosphine, and trioctylphosphine oxide.

Examples of the precursor of In include, but are not limited to, an acetate, a carboxylate, and a halide including In.

Examples of the precursor of P include, but are not limited to, organic compounds and gases including P. In the case where the precursor is a gas, the core can be formed by reacting while the gas is being injected into the precursor mixture liquid including the compounds other than the gas.

The semiconductor nanoparticles may include one or more elements other than In and P as long as the effects of the present invention are not impaired. In this case, the precursor of the above-described element may be added at the time of core formation. Examples of the additive include, but are not limited to, carboxylic acids, amines, thiols, phosphines, phosphine oxides, phosphinic acids, and phosphonic acids as dispersing agent. The dispersing agent can also serve as the solvent.

After forming the core of the semiconductor nanoparticles, the emission properties of the semiconductor nanoparticles can be improved by adding a halide, if necessary.

In an embodiment, a precursor solution in which the In precursor and, if necessary, the dispersing agent are added into the solvent is mixed under vacuum, the resultant mixture is once heated at 100° C. to 300° C. for 6 hours to 24 hours, and thereafter the P precursor is further added. The obtained mixture is heated at 200° C. to 400° C. for 3 minutes to 60 minutes and thereafter cooled. The halogen precursor is further added and the resultant mixture is subjected to heat treatment at 25° C. to 300° C., preferably 100° C. to 300° C., and more preferably 150° C. to 280° C., whereby a core particle dispersion liquid including the core particles can be obtained.

Addition of a shell-forming precursor to the synthesized core particle dispersion liquid allows the semiconductor nanoparticles to have a core/shell structure and the fluorescence quantum yield (QY) and stability to be improved.

It is conceivable that the elements constituting the shell have a structure such as an alloy, a heterostructure, or an amorphous structure on the surface of the core particle. It is also conceivable that some of the elements move to the inside of the core particles due to diffusion.

The added shell-forming elements mainly exist near the surface of the core particles and have a role of protecting the semiconductor nanoparticles from external factors. In the core/shell structure of the semiconductor nanoparticles, the shell preferably covers at least a part of the core and more preferably uniformly covers the entire surface of the core particles.

In an embodiment, the Zn precursor and the Se precursor are added to the core particle dispersion liquid described above and thereafter the resultant mixture is heated at 150° C. to 300° C. and preferably 180° C. to 250° C. Thereafter, the Zn precursor and the S precursor are added and the resultant mixture is heated at 200° C. to 400° C. and preferably 250° C. to 350° C. This allows the core/shell type semiconductor nanoparticles to be obtained.

Here, although not particularly limited, carboxylates such as zinc acetate, zinc propionate, and zinc myristate, halides such as zinc chloride and zinc bromide, and organic salts such as diethyl zinc can be used as the Zn precursor.

Phosphine selenides such as tributylphosphine selenide, trioctylphosphine selenide, and tris (trimethylsilyl) phosphine selenide, selenols such as benzene selenol and selenocysteine, and a selenium/octadecene solution can be used as the Se precursor.

Phosphine sulfides such as tributylphosphine sulfide, trioctylphosphine sulfide, and tris(trimethylsilyl)phosphine sulfide, thiols such as octanethiol, dodecanethiol, and octadecanethiol, and a sulfur/octadecene solution can be used as the S precursor.

The shell precursors may be previously mixed and added in one time or in multiple times or each of the precursors may be added separately in one time or in multiple times. In the case where the shell precursor is added in multiple times, each shell precursor after addition may be heated with the temperature being changed.

In the present invention, the method for preparing the semiconductor nanoparticles is not particularly limited. In addition to the methods described above, preparation methods such as a hot injection method, a homogeneous solvent method, a reverse micelle method, and a CVD method which have been conventionally used, and other methods can be employed.

With respect to the semiconductor nanoparticle aggregate according to the present invention, the peak wavelength ($\lambda^1_{MAX}$) of the emission spectrum ($\lambda^1$) when the semiconductor nanoparticle aggregate according to the present invention is excited with excitation light of 450 nm in a state where the semiconductor nanoparticle aggregate is dispersed in a dispersion medium is from 605 to 655 nm. The semiconductor nanoparticle aggregate having the peak wavelength ($\lambda^1_{MAX}$) of the emission spectrum ($\lambda^1$) in the above range allows red emission having a wavelength of from 595 to 665 nm to be achieved by excitation with blue light of from 430 to 500 nm.

With respect to the semiconductor nanoparticle aggregate according to the present invention, the full width at half maximum ($FWHM^1$) of the emission spectrum ($\lambda^1$) when the semiconductor nanoparticle aggregate according to the present invention is excited with excitation light of 450 nm in a state where the semiconductor nanoparticle aggregate according to the present invention is dispersed in a dispersion medium is 43 nm or less, preferably 38 nm or less, and particularly preferably 35 nm or less. The semiconductor nanoparticle aggregate having the full width at half maximum ($FWHM^1$) of the emission spectrum ($\lambda^1$) within the above range allows high-purity emission to be obtained.

With respect to the semiconductor nanoparticle aggregate according to the present invention, the emission spectrum ($\lambda^2$) from each particle obtained by exciting the semiconductor nanoparticles constituting the semiconductor nanoparticle aggregate according to the present invention with excitation light of 445 nm satisfies all the following requirements (1) to (3).

Requirement (1) The average value of the full width at half maximum ($FWHM^2$) of the emission spectrum ($\lambda^2$) is 28 nm or less, preferably 25 nm or less, and particularly preferably 24 nm or less. The term "average value of the full width at half maximum ($FWHM^2$) of the emission spectrum ($\lambda^2$)" refers to the value determined by measuring the full width at half maximum ($FWHM^2$) of the emission spectrum ($\lambda^2$) from each particle obtained by exciting the semiconductor nanoparticles constituting the semiconductor nanoparticle aggregate with excitation light of 445 nm 5 times per particle to 40 semiconductor nanoparticles and averaging 200 obtained values in total.

Requirement (2) The standard deviation ($SD^1$) of the peak wavelength ($\lambda^2_{MAX}$) of the emission spectrum ($\lambda^2$) is 10 nm or more and 30 nm or less and preferably 10 nm or more and 25 nm or less. The term "the standard deviation ($SD^1$) of the peak wavelength ($\lambda^2_{MAX}$) of the emission spectrum ($\lambda^2$)" refers to a value of the standard deviation determined by measuring the peak wavelength ($\lambda^2_{MAX}$) of the emission spectrum ($\lambda^2$) from each particle obtained by exciting the semiconductor nanoparticles constituting the semiconductor nanoparticle aggregate with excitation light of 445 nm 5 times per particle to 40 semiconductor nanoparticles and calculating 200 obtained values in total.

Requirement (3) The standard deviation ($SD^2$) of the full width at half maximum ($FWHM^2$) of the emission spectrum ($\lambda^2$) is 12 nm or less, preferably 7 nm or less, and particularly preferably 6 nm or less. The term "the standard deviation ($SD^2$) of the full width at half maximum ($FWHM^2$) of the emission spectrum (2)" refers to a value of the standard deviation determined by measuring the full width at half maximum ($FWHM^2$) of the emission spectrum ($\lambda^2$) from each particle obtained by exciting the semiconductor nanoparticles constituting the semiconductor nanoparticle aggregate with excitation light of 445 nm 5 times per particle to 40 semiconductor nanoparticles and calculating 200 obtained values in total.

According to the study conducted by the inventors of the present invention, even when the semiconductor nanoparticle aggregate is produced by the same production method using the same raw material composition and indicates almost the same peak wavelength ($\lambda^1_{MAX}$), properties such as the full width at half maximum ($FWHM^1$) of the emission spectrum ($\lambda^1$) of the entire aggregate and the quantum yield (QY) have been frequently and significantly different. As a result of further detailed research on the cause of the difference, the inventors of the present invention have found that with respect to the semiconductor nanoparticle aggregate having a peak wavelength ($\lambda^1_{MAX}$) of the emission spectrum ($\lambda^1$) from 605 to 655 nm with excitation light of 450 nm, correlation between the properties of the emission spectrum ($\lambda^1$) and the average value of the full width at half maximum ($FWHM^2$) and the standard deviation ($SD^2$) of the emission spectrum ($\lambda^2$) of the individual semiconductor nanoparticle constituting the semiconductor nanoparticle aggregate exists. The present invention has been attained based on such new findings.

It is important that the individual semiconductor nanoparticle is produced under uniform and homogeneous production conditions as much as possible in order to control the average value of the full width at half maximum ($FWHM^2$) and the standard deviation ($SD^2$). In particular, during heating of the core particles at the time of producing the core particles, the temperature is preferably raised as rapidly as possible to align the timing of the nucleation and particle growth of the core particles. At this time, a temperature increasing rate of 5° C. or more per minute allows the semiconductor nanoparticle aggregate according to the present invention to be easily obtained. The temperature increasing rate is preferably 10° C. or more per minute. When the semiconductor nanoparticle aggregate according to the present invention is produced, there is no particular upper limit to the heating rate. When the production apparatus becomes complicated in order to increase the temperature increasing rate, however, the production cost will increase. From the industrial/commercial viewpoint, the temperature increasing rate is practically 3,000° C. or less per minute.

With respect to the semiconductor nanoparticle aggregate according to the present invention, when Requirement (1): The average value of the full width at half maximum ($FWHM^2$) of the emission spectrum ($\lambda^2$) is 28 nm or less; Requirement (2): The standard deviation ($SD^1$) of the peak wavelength ($\lambda^2_{MAX}$) of the emission spectrum ($\lambda^2$) is 10 nm or more and 30 nm or less; and Requirement (3): The standard deviation ($SD^2$) of the full width at half maximum ($FWHM^2$) of the emission spectrum ($\lambda^2$) is 12 nm or less are satisfied, the semiconductor nanoparticle aggregate according to the present invention can satisfy both a high quantum yield (QY) and a high full width at half maximum ($FWHM^1$).

As the semiconductor nanoparticle aggregate according to the present invention, a semiconductor nanoparticle aggregate having a full width at half maximum ($FWHM^1$) of 35 nm or less, the average value of a full width at half maximum ($FWHM^2$) of 24 nm or less, and a standard deviation ($SD^2$) of 6 nm or less is preferable because a particularly narrow full width at half maximum ($FWHM^1$) can be obtained.

The quantum yield (QY) of the semiconductor nanoparticle aggregate according to the present invention is preferably 80% or more, more preferably 85% or more, and particularly preferably 90% or more.

The elemental analysis of the semiconductor nanoparticle aggregate can be performed using a high frequency inductively coupled plasma emission spectrometer (ICP) or an X-ray fluorescence analyzer (XRF). In the ICP measurement, purified semiconductor nanoparticles are dissolved with nitric acid, and the resultant solution was heated and thereafter diluted with water to measure the elements by a calibration curve method using an ICP emission spectrometer (ICPS-8100, manufactured by Shimadzu Corporation). In the XRF measurement, a filter paper impregnated with a dispersion liquid is placed in a sampling holder and a quantitative analysis is performed using an X-ray fluorescence analyzer (ZSX100e, manufactured by Rigaku Corporation).

The peak wavelength ($\lambda^1_{MAX}$), full width at half maximum ($FWHM^1$), and a fluorescence quantum yield (QY) of the emission spectrum ($\lambda^1$) of the semiconductor nanoparticle aggregate can be measured using a fluorescence quantum yield measurement system (QE-2000, manufactured by Otsuka Electronics Co., Ltd) and a visible ultraviolet spectrophotometer (V670, manufactured by JASCO Corporation). A dispersion liquid in which the semiconductor nanoparticles are dispersed in a dispersion medium is irradiated with excitation light of 450 nm to give an emission spectrum. The peak wavelength ($\lambda^1_{MAX}$) is determined from the emission spectrum ($\lambda^1$) after re-excitation correction in which a re-excitation fluorescence emission spectrum generated by fluorescence emission caused by re-excitation is eliminated from the emission spectrum obtained here and the fluorescence quantum yield (QY) and the full width at half maximum ($FWHM^1$) are calculated. Examples of the dispersion medium include normal hexane, octadecene, toluene, acetone, and PGMEA. The excitation light used for the measurement is set to a single light of 450 nm. As the dispersion liquid, a dispersion liquid in which the concentration of the semiconductor nanoparticles is adjusted so that the absorption rate is from 20 to 30% is used. On the other hand, the absorption spectrum can be measured by irradiating the dispersion liquid in which the semiconductor nanoparticles are dispersed in the dispersion medium with ultraviolet to visible light.

The measurement of the peak wavelength ($\lambda^2_{MAX}$) and full width at half maximum ($FWHM^2$) of the emission spectrum ($\lambda^2$) from each particle obtained by exciting the individual semiconductor nanoparticle constituting the semiconductor nanoparticle aggregate according to the present invention with excitation light of 445 nm can be performed by known methods described in, for example, "Kameyama et al., ACS Appl. Mater. Interfaces 2018, 10, 42844-42855", "Uematsu et al., NPG Asia Materials (2018) 10, 713-726", and "Sharma et al., ACS Nano 2019, 13, 624-632". As an example, the measurement procedure of the peak wavelength ($\lambda^2_{MAX}$) and the full width at half maximum (FWHM$^2$) of the emission spectrum ($\lambda^2$) from each particle is described in Examples described below.

In Examples described below, the average value of the full width at half maximum (FWHM$^2$) of the emission spectrum ($\lambda^2$), the standard deviation (SD$^1$) of the peak wavelength ($\lambda^2_{MAX}$), and the standard deviation (SD$^2$) of the full width at half maximum (FWHM$^2$) are calculated from the peak wavelength ($\lambda^2_{MAX}$) and full width at half maximum (FWHM$^2$) of the emission spectrum ($\lambda^2$) from each particle obtained as described above.

In Examples described below, when the peak wavelength ($\lambda^1_{MAX}$) and full width at half maximum (FWHM$^1$) of the emission spectrum ($\lambda^1$) of the semiconductor nanoparticle aggregate and the peak wavelength ($\lambda^2_{MAX}$) and the full width at half maximum (FWHM$^2$) of the emission spectrum ($\lambda^2$) from each particle are measured, all the values are measured up to the third place after the decimal point and the obtained values are rounded to the second place after the decimal point. From thus obtained measured values, when the average value of the full width at half maximum (FWHM$^2$) of the emission spectrum ($\lambda^2$) from each particle, the standard deviation (SD$^1$) of the peak wavelength ($\lambda^2_{MAX}$), and the standard deviation (SD$^2$) of the full width at half maximum (FWHM$^2$) are determined, all the values are calculated up to the second place after the decimal point. Thereafter, all of these values are rounded to the first place after the decimal point to determine the integer place and respective values are listed in Table 1 and Table 2 below as the peak wavelength ($\lambda^1_{MAX}$), the full width at half maximum (FWHM$^1$), the peak wavelength ($\lambda^2_{MAX}$), the average value of the full width at half maximum (FWHM$^2$), the standard deviation (SD$^1$), and the standard deviation (SD$^2$).

Figure 3:
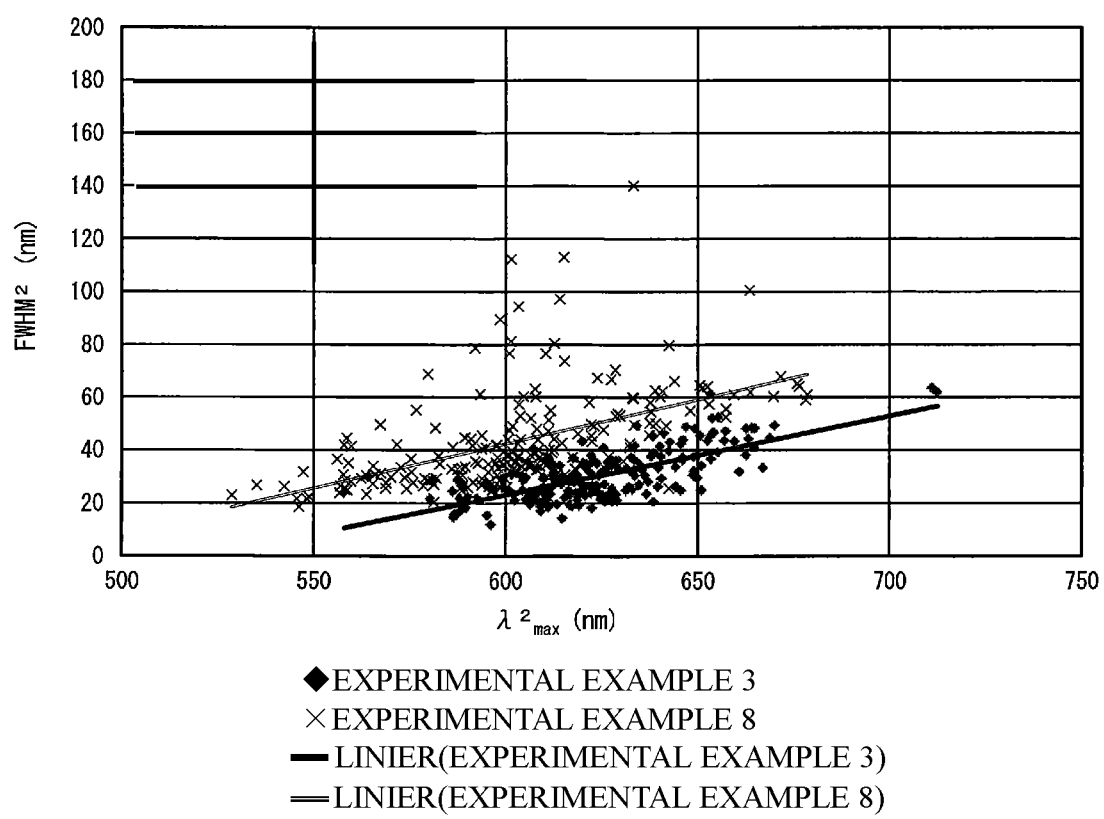
FIG. 3 is an example of an emission spectrum of one particle.

As an example, a scatter plot of the measured values (200 values in each example) of the peak wavelength ($\lambda^2_{MAX}$) and the full width at half maximum (FWHM$^2$) of the emission spectrum data ($\lambda^2$) measured for each particle in Experimental Example 3 (Example) and Experimental Example 8 (Comparative Example) described below is illustrated as FIG. 3. As is clear from FIG. 3, the distribution tendency of the peak wavelength ($\lambda^2_{MAX}$) and the full width at half maximum (FWHM$^2$) is clearly different between the Experimental Example belonging to the Examples of the present invention and the Experimental Example belonging to Comparative Examples. Such distribution tendency is also observed in other Examples and Comparative Examples.

(Semiconductor Nanoparticle Aggregate Dispersion Liquid)

The semiconductor nanoparticle aggregate according to the present invention can be dispersed in a polar dispersion medium to form a semiconductor nanoparticle aggregate dispersion liquid. In the present invention, the state where the semiconductor nanoparticle aggregate is dispersed in the dispersion medium refers to a state where the semiconductor nanoparticle composite does not precipitate or a state where visible turbidity (cloudiness) does not remain in the case where the semiconductor nanoparticle aggregate and the dispersion medium are mixed. A product in which the semiconductor nanoparticle aggregate is dispersed in the dispersion medium is referred to as the semiconductor nanoparticle aggregate dispersion liquid.

In the present invention, as the organic dispersion medium of the semiconductor nanoparticle aggregate dispersion liquid according to the present invention, for example, alcohols such as methanol, ethanol, isopropyl alcohol, and normal propyl alcohol; ketones such as acetone, methyl ethyl ketone, methyl isobutyl ketone, cyclopentanone, and cyclohexanone; esters such as methyl acetate, ethyl acetate, isopropyl acetate, normal-propyl acetate, normal-butyl acetate, and ethyl lactate; ethers such as diethyl ether, dipropyl ether, dibutyl ether, and tetrahydrofuran; glycol ethers such as ethylene glycol monomethyl ether, ethylene glycol monoethyl ether, diethylene glycol monomethyl ether, ethylene glycol diethyl ether, diethylene glycol dimethyl ether, propylene glycol monomethyl ether (PGME), propylene glycol monoethyl ether, propylene glycol monopropyl ether, propylene glycol monobutyl ether, propylene glycol dimethyl ether, dipropylene glycol dimethyl ether, propylene glycol diethyl ether, and dipropylene glycol diethyl ether; glycol ether esters such as ethylene glycol acetate, ethylene glycol monoethyl ether acetate, diethylene glycol monoethyl ether acetate, diethylene glycol monobutyl ether acetate, propylene glycol monomethyl ether acetate (PGMEA), and dipropylene glycol monoethyl ether acetate are selected. Dispersing the semiconductor nanoparticle aggregate according to the present invention in these organic dispersion media allows the semiconductor nanoparticle aggregate to be used while the dispersibility of the semiconductor nanoparticle aggregate is being retained when the semiconductor nanoparticle aggregate is applied to dispersion in a cured film or a resin described below.

In the present invention, a monomer can be selected as the dispersion medium of the semiconductor nanoparticle aggregate dispersion liquid according to the present invention. The monomer is not particularly limited and (meth)acrylate monomers from which a wide range of applications of semiconductor nanoparticles can be selected is preferable. Depending on the application of the semiconductor nanoparticle aggregate, the monomer is selected from (meth)acrylate monomers such as methyl (meth)acrylate, ethyl (meth)acrylate, propyl (meth)acrylate, butyl (meth)acrylate, isobutyl (meth)acrylate, isoamyl (meta)acrylate, octyl (meth)acrylate, 2-ethylhexyl (meth)acrylate, dodecyl (meth)acrylate, isodecyl (meth)acrylate, lauryl (meth)acrylate, stearyl (meth)acrylate, cyclohexyl (meth)acrylate, isobornyl (meth)acrylate, 3,5,5-trimethylcyclohexanol (meth)acrylate, dicyclopentanyl (meth)acrylate, dicyclopentenyl (meth)acrylate, methoxyethyl (meth)acrylate, ethyl carbitol (meth)acrylate, methoxytriethylene glycol acrylate, 2-ethylhexyl diglycol acrylate, methoxypolyethylene glycol acrylate, methoxydipropylene glycol acrylate, phenoxyethyl (meth)acrylate, 2-phenoxydiethylene glycol (meth)acrylate, 2-phenoxypolyethylene glycol (meth)acrylate (n≈2), tetrahydrofurfuryl (meth)acrylate, 2-hydroxyethyl acrylate, 2-hydroxypropyl (meth)acrylate, 4-hydroxybutyl (meth)acrylate, 2-hydroxybutyl (meth)acrylate, dicyclopentanyloxyethyl (meth)acrylate, isobornyloxyethyl (meth)acrylate, adamantyl (meth)acrylate, dimethyladamantyl (meth)acrylate, dicyclopentenyloxyethyl (meth)acrylate, benzyl (meth)acrylate, ω-carboxy-polycaprolactone (n 2) monoacrylate, 2-hydroxy-3-phenoxypropyl acrylate, 2-hydroxy-3-phenoxyethyl (meth)acrylate, (2-methyl-2-ethyl-1,3-dioxolan-4)-yl) methyl (meth)acrylate, (3-ethyloxetane-3-yl)methyl (meth)acrylate, o-phenylphenolethoxy (meth)acrylate, dimethylamino (meth)acrylate, diethylamino (meth)acrylate, 2-(meth)acryloyloxyethylphthalic acid, 2-(meth)acryloyloxyethylhexahydrophthalic acid, glycidyl (meth)acrylate, 2-(meth)acryloyloxyethyl phosphate, acryloylmorpholine, dimethyl acrylamide, dimethylaminopropyl acrylamide, isopropyl acrylamide, diethyl acrylamide, hydroxyethyl acrylamide, and N-acryloyloxyethyl hexahydrophthalimide. These monomers can be used singly or in combination of two or more of the monomers. In particular, the acrylic monomer is preferably one or a mixture of two or more of the acrylic monomers selected from lauryl (meth)acrylate and 1,6-hexadiol di(meth)acrylate depending on the application of the semiconductor nanoparticle aggregate dispersion liquid.

In the present invention, a prepolymer can be selected as the dispersion medium of the semiconductor nanoparticle aggregate dispersion liquid according to the present invention. The prepolymer is not particularly limited. Examples of the prepolymer include an acrylic resin prepolymer, a silicone resin prepolymer, and an epoxy resin prepolymer.

(Semiconductor Nanoparticle Aggregate Composition)

In the present invention, the monomer or the prepolymer can be selected as the dispersion medium of the semiconductor nanoparticle aggregate dispersion liquid according to the present invention to form a semiconductor nanoparticle aggregate composition. In other words, the semiconductor nanoparticle aggregate composition according to the present invention is a semiconductor nanoparticle aggregate composition in which the semiconductor nanoparticle aggregate according to the present invention is dispersed in the monomer or the prepolymer. The monomer or the prepolymer is not particularly limited. Examples thereof include a radically polymerizable compound containing an ethylenically unsaturated bond, a siloxane compound, an epoxy compound, an isocyanate compound, and a phenol derivative. Examples of the monomer include the monomers used as the above-described dispersion medium. Examples of the prepolymer include the prepolymer used as the above-described dispersion medium.

The semiconductor nanoparticle aggregate composition according to the present invention can further include a cross-linking agent. The cross-linking agent may be selected from a polyfunctional (meth)acrylate, a polyfunctional silane compound, a polyfunctional amine, a polyfunctional carboxylic acid, a polyfunctional thiol, a polyfunctional alcohol, and a polyfunctional isocyanate depending on the kind of the monomer in the semiconductor nanoparticle aggregate composition according to the present invention.

The semiconductor nanoparticle aggregate composition according to the present invention may further include various organic solvents that do not affect the curing, including aliphatic hydrocarbons such as pentane, hexane, cyclohexane, isohexane, heptane, octane, and petroleum ether, alcohols, ketones, esters, glycol ethers, glycol ether esters, aromatic hydrocarbons such as benzene, toluene, xylene, and mineral spirits, and alkyl halides such as dichloromethane and chloroform. The above-described organic solvent can be used not only for diluting the semiconductor nanoparticle aggregate composition but can also be used as the organic dispersion medium. In other words, the semiconductor nanoparticle aggregate according to the present invention is dispersed in the above-described organic solvent, whereby the semiconductor nanoparticle aggregate dispersion liquid can be provided.

The semiconductor nanoparticle aggregate composition according to the present invention may further includes a suitable initiator, scattering agent, catalyst, binder, surfactant, adhesion accelerator, antioxidant, ultraviolet ray absorber, anti-aggregation agent, or dispersing agent depending on the kind of the monomer in the semiconductor nanoparticle aggregate composition.

In order to improve the optical properties of the semiconductor nanoparticle aggregate composition according to the present invention or the semiconductor nanoparticle aggregate cured film according to the present invention described below, the semiconductor nanoparticle aggregate composition may further include a scattering agent. The scattering agent is a metal oxide such as titanium oxide or zinc oxide and the particle diameter of the scattering agent is preferably from 100 nm to 500 nm. From the viewpoint of the effect of scattering, the particle diameter of the scattering agent is more preferably from 200 nm to 400 nm. Including the scattering agent allows the absorbance to be improved by about twice. The content of the scattering agent in the semiconductor nanoparticle aggregate composition according to the present invention is preferably from 2% by mass to 30% by mass relative to the composition and from the viewpoint of retaining the patternability of the composition, the content is more preferably from 5% by mass to 20% by mass.

When the semiconductor nanoparticle aggregate composition according to the present invention is formed into a film of 10 μm, the absorbance of the film to light having a wavelength of 450 nm from the normal direction of the film is preferably 1.0 or more, more preferably 1.3 or more, and further preferably 1.5 or more. This allows the light from the backlight to be efficiently absorbed and thus the thickness of the cured film described below to be reduced and the applied device to be formed in a small size.

(Diluted Composition)

The diluted composition is a product formed by diluting the above-described semiconductor nanoparticle aggregate composition according to the present invention with an organic solvent.

The organic solvent for diluting the semiconductor nanoparticle aggregate composition is not particularly limited. Example of the solvent include aliphatic hydrocarbons such as pentane, hexane, cyclohexane, isohexane, heptane, octane, and petroleum ether, alcohols, ketones, esters, glycol ethers, glycol ether esters, aromatic hydrocarbons such as benzene, toluene, xylene, and mineral spirits, and alkyl halides such as dichloromethane and chloroform. Of these solvents, glycol ethers and glycol ether esters are preferable from the viewpoints of solubility for a wide range of resins and film uniformity at the time of film coating.

(Semiconductor Nanoparticle Aggregate Cured Film)

The semiconductor nanoparticle aggregate cured film according to the present invention is a film including the semiconductor nanoparticle aggregate according to the present invention and refers to a film that is cured. The semiconductor nanoparticle aggregate cured film according to the present invention can be obtained by curing the above-described semiconductor nanoparticle aggregate composition or diluted composition in the form of a film.

The semiconductor nanoparticle aggregate cured film according to the present invention includes the semiconductor nanoparticles according to the semiconductor nanoparticle aggregate of the present invention, a ligand coordinated on the surface of the semiconductor nanoparticles, and a macromolecule matrix. In other words, the semiconductor nanoparticle aggregate cured film according to the present invention is a cured film in which the semiconductor nanoparticle aggregate according to the present invention is dispersed in the macromolecule matrix.

Example of the macromolecule matrix includes, but are not particularly limited to, a (meth)acrylic resin, a silicone resin, an epoxy resin, a silicone resin, a maleic acid resin, a butyral resin, a polyester resin, a melamine resin, a phenol resin, and a polyurethane resin. The semiconductor nanoparticle aggregate cured film according to the present invention may be obtained by curing the semiconductor nanoparticle aggregate composition according to the present invention described above. The semiconductor nanoparticle aggregate cured film according to the present invention may further include a cross-linking agent.

The method for curing the film is not particularly limited. The film can be cured by curing methods, such as heat treatment and ultraviolet treatment, suitable for the composition constituting the film.

When the thickness of the semiconductor nanoparticle composite cured film according to the present invention is set to 10 μm, the absorbance to light having a wavelength of 450 nm from the normal direction of the semiconductor nanoparticle composite cured film is preferably 1.0 or more, more preferably 1.3 or more, and further preferably 1.5 or more.

The semiconductor nanoparticle aggregate cured film according to the present invention includes the semiconductor nanoparticle aggregate having high light emitting properties, and thus the semiconductor nanoparticle aggregate cured film having high light emission properties can be provided. The fluorescence quantum yield of the semiconductor nanoparticle composite aggregate according to the present invention is preferably 70% or more and more preferably 80% or more.

The thickness of the semiconductor nanoparticle aggregate cured film according to the present invention is preferably 50 μm or less, more preferably 20 μm or less, and further preferably 10 μm in order to form a small size device to which the semiconductor nanoparticle aggregate cured film is applied.

Constitutions, methods, procedures, processes, and the like described in the present specification are examples and do not limit the present invention. Within the scope of the present invention, a large number of modified aspects can be applied.

EXAMPLES

Semiconductor nanoparticles were prepared in accordance with the following method and the composition and optical properties of the obtained semiconductor nanoparticles were measured.

Experimental Example 1

<Production of Core Particles>

Indium acetate (0.3 mmol) and zinc oleate (0.55 mmol) were added to a mixture of oleic acid (0.9 mmol), 1-dodecanethiol (0.1 mmol), and octadecene (10 mL). The resultant mixture was heated under vacuum (<20 Pa) from room temperature to 120° C. at a temperature increasing rate of 10° C. per minute to react for 1 hour. The mixture reacted under vacuum (<20 Pa) was placed under a nitrogen atmosphere at 25° C. and tris(trimethylsilyl) phosphine (0.23 mmol) was added. Thereafter the resultant mixture was heated to 300° C. at a temperature increasing rate of 10° C. per minute to react for 10 minutes. The reaction liquid was cooled to 25° C. and octanoic chloride (0.60 mmol) was injected. The resultant mixture was heated to 250° C. at a temperature increasing rate of 10° C. per minute and reacted for 30 minutes. Thereafter the reacted mixture was cooled to 25° C. to give a dispersion solution of core particles.

<Precursor for Shell Formation>

40 mmol of zinc oleate and 75 mL of octadecene were mixed and heated under vacuum at 110° C. for 1 hour to prepare a Zn precursor solution of [Zn]=0.4 M.

22 mmol of selenium powder and 10 mL of trioctylphosphine were mixed in nitrogen, and the resultant mixture was stirred until all components were dissolved to give [Se]=2.2 M trioctylphosphine selenide.

22 mmol of sulfur powder and 10 mL of trioctylphosphine were mixed in nitrogen, and the resultant mixture was stirred until all components were dissolved to give [S]=2.2 M trioctylphosphine sulfide.

<Formation of Shell>

The dispersion solution of the core particles was heated to 250° C. At 250° C., 4.3 mL of the Zn precursor solution and 1.5 mL of trioctylphosphine selenide were added and the resultant mixture was reacted for 30 minutes to form a ZnSe shell on the surface of InP-based semiconductor nanoparticles. Furthermore, 3.8 mL of the Zn precursor solution and 0.5 mL of trioctylphosphine sulfide were added and the temperature was raised to 280° C. to react for 1 hour to form a ZnS shell.

The obtained semiconductor nanoparticles were confirmed to have a core/shell structure by observing the obtained semiconductor nanoparticles with STEM-EDS.

<Purification>

Acetone was added to the solution in which thus obtained semiconductor nanoparticles having the core/shell structure were dispersed to aggregate the semiconductor nanoparticles. Subsequently, after centrifugation (4,000 rpm, 10 minutes), the supernatant was removed and the semiconductor nanoparticles were redispersed in hexane. This operation was repeated to give purified semiconductor nanoparticles.

<Analysis>

(Composition)

Composition analysis was performed using a high frequency inductively coupled plasma emission spectrometer (ICP) and an X-ray fluorescence analyzer (XRF). The analysis results are listed in Table 1 in terms of a molar ratio relative to indium.

(Analysis of Peak Wavelength ($\lambda^1_{MAX}$), Full Width at Half Maximum ($FWHM^1$), and Fluorescence Quantum Yield (QY))

As described above, the emission spectrum ($\lambda^1$) of the semiconductor nanoparticle aggregate was measured using the quantum yield measurement system and the quantum yield (QY) of the semiconductor nanoparticle aggregate and the full width at half maximum ($FWHM^1$) and peak wavelength ($\lambda^1_{MAX}$) of the semiconductor nanoparticle aggregate were measured. At this time, the excitation light was set to a single wavelength of 450 nm. As the dispersion liquid used for the measurement, a liquid of which concentration was adjusted so that the absorption rate was from 20 to 30% was used. Furthermore, using an ultraviolet-visible spectrophotometer, the dispersion liquid of the semiconductor nanoparticles was irradiated with light from ultraviolet to visible light to measure the absorption spectrum. As the dispersion liquid used for measuring the absorption spectrum, a dispersion liquid in which the concentration was adjusted so that the amount of semiconductor nanoparticles was 1 mg relative to 1 mL of the dispersion medium was used. The analysis results are listed in Table 2.

(Analysis of Full Width at Half Maximum ($FWHM^2$), Standard Deviation ($SD^1$) of Peak Wavelength ($\lambda^2_{MAX}$), and Standard Deviation ($SD^2$) of the Full Width at Half Maximum ($FWHM^2$))

<Measurement Preparation>

In the following Experimental Example, an inverted research optical microscope or inverted imaging platform (IX73, manufactured by Olympus Corporation) was used to measure the spectral spectrum of fluorescence emission emitted from the individual semiconductor nanoparticle. UPlan FNL 100×/1.30 NA, Oil manufactured by Olympus Corporation was used as a high numerical aperture objective lens. To the microscope, CLP-50-D Type manufactured by Bunkoukeiki Co., Ltd. as an image spectroscopic measurement type imaging spectroscope for connecting to a microscope and iXon manufactured by Andor Technology Co., Ltd. as a high-sensitivity electron multiplier type CCD camera were connected.

Fluorescence emission from the individual semiconductor nanoparticle was continuously recorded at regular capture intervals with a CCD camera through the microscope as a spectral image converted by the imaging spectroscope.

In addition, a slit having a width of 100 nm was arranged between the microscope and the spectroscope so that an image of only a part of the entire field of view was capable of being captured.

The semiconductor laser for exciting the semiconductor nanoparticles was configured so that TC-20-4450 manufactured by NEOARK CORPORATION capable of emitting blue laser light having a wavelength of 445 nm was used, the laser light was introduced into the microscope and converged, and thereafter the measurement sample described below was irradiated with the laser light.

At this time, in order to prevent unnecessary excitation light and scattered light from entering the detector, an optical filter was appropriately installed at a necessary place.

The semiconductor nanoparticles to be measured were dispersed on a quartz substrate by the method described below to prepare a measurement sample.

First, the semiconductor nanoparticles constituting the semiconductor nanoparticle aggregate as the measurement target were dispersed in a toluene solution obtained by dissolving from about 2 to 3% by mass of polymethylmethacrylate (PMMA) in toluene for optical analysis so that the aggregation did not occur. At this time, in the spectrum measurement described below, the density was preferably adjusted so that the distance between the semiconductor nanoparticles each other was set to 1 μm or more for not misidentifying the plurality of particles as one particle.

Thereafter, a synthetic quartz substrate (Labo-CG, manufactured by DAICO MFG Co., Ltd.) not emitting light by excitation with the blue laser light was attached to a spin coater, an appropriate amount of the above-described toluene solution in which the semiconductor nanoparticles were dispersed was dropped on the quartz substrate, and the toluene solution was spin-coated at a rotation speed in the range of from 1,000 to 3,000 rpm for 10 to 30 seconds, and thereafter the coated solution was naturally dried, whereby a thin film in which the semiconductor nanoparticles were dilutely dispersed in a PMMA film was formed on the quartz substrate.

This substrate was placed above the objective lens of the microscope as a sample substrate for measurement. In the above-described preparations and operations, care must be taken not to mix impurities that emit light with the excitation laser light.

<Measurement>

All observations in following Experimental Examples were performed in the air at room temperature of from 20 to 25° C.

The magnification of the microscope and the irradiation range of the excitation light were set in a timely manner so that the entire range where the sample substrate was irradiated with the excitation light was capable of being captured by the CCD camera. For the intensity of the laser light for exciting the semiconductor nanoparticles, output was adjusted so that the excitation energy per unit area of the sample substrate was within the range of from 100 to 250 W/cm$^2$.

In a state where only the spectral images of several semiconductor nanoparticles were captured by the CCD camera through the slit set between the microscope and the spectroscope, 100 points (for 100 seconds) of the observed spectral images were recorded at 1.0 second intervals (1 Hz).

In the obtained spectral image, the wavelength was calculated by comparing with the spectral image of the reference light of which wavelength was previously known and the intensity was corrected by calculation in which the intensity of the particle-free portion as the background was subtracted from the overall intensity. The data points of the wavelength and intensity of the individual semiconductor nanoparticle were determined and these data were further gauss-fitted using appropriate graph software, whereby the emission spectrum ($\lambda^2$), the peak wavelength ($\lambda^2_{MAX}$) of the emission spectrum ($\lambda^2$), and the full width at half maximum (FWHM$^2$) of the emission spectrum ($\lambda^2$) of the individual semiconductor nanoparticle were quantified.

In this Example, the above quantification was performed by randomly selecting 40 semiconductor nanoparticles from all the captured images and quantifying the randomly selected 5 points of spectra per particle. Based on 200 measurement data in total obtained as described above, the average value of the full width at half maximum (FWHM$^2$), the standard deviation (SD$^1$) of the peak wavelength ($\lambda^2_{MAX}$), and the standard deviation (SD$^2$) of the full width at half maximum (FWHM$^2$) were obtained. The analysis results are also listed in Table 2.

Experimental Examples 2 to 6

The semiconductor nanoparticles were produced in the same manner as the manner in Experimental Example 1 and thereafter the analysis was performed in the same manner as the manner in Experimental Example 1 except that the composition ratio of the raw materials used in the production was varied. The analysis results are also listed in Table 1 and Table 2.

Experimental Examples 7 to 11

The semiconductor nanoparticles were produced in the same manner as the manner in Experimental Example 1 and thereafter the analysis was performed in the same manner as the manner in Experimental Example 1 except that the temperature increasing rate at the time of the production of the core particles was 3° C. per minute and that the composition ratio of the raw materials used in the production was varied. The analysis results are also listed in Table 1 and Table 2.

TABLE 1

|  | Experimental Example | P/In | Zn/In | Se/In | S/In | Halogen/In | (Zn + Se + S)/In |
|---|---|---|---|---|---|---|---|
| Example | 1 | 0.6 | 12.9 | 11.2 | 3.1 | 2.6 | 27.2 |
|  | 2 | 0.4 | 18.7 | 11.9 | 7.5 | 1.3 | 38.1 |
|  | 3 | 0.5 | 13.0 | 7.7 | 5.0 | 1.0 | 25.7 |

TABLE 1-continued

|  | Experimental Example | P/In | Zn/In | Se/In | S/In | Halogen/In | (Zn + Se + S)/In |
|---|---|---|---|---|---|---|---|
|  | 4 | 0.8 | 11.3 | 6.9 | 4.2 | 1.2 | 22.5 |
|  | 5 | 0.4 | 19.2 | 12.2 | 8.2 | 2.2 | 39.7 |
|  | 6 | 0.5 | 10.3 | 7.2 | 4.7 | 1.8 | 22.3 |
| Comparative | 7 | 0.7 | 22.4 | 1.6 | 4.5 | 0.9 | 28.4 |
| Example | 8 | 0.5 | 5.0 | 0.0 | 5.8 | 0.1 | 10.8 |
|  | 9 | 0.6 | 11.8 | 1.7 | 3.2 | 1.0 | 16.8 |
|  | 10 | 0.8 | 21.4 | 4.2 | 18.1 | 0.4 | 43.7 |
|  | 11 | 0.6 | 14.2 | 9.9 | 14.1 | 1.2 | 38.2 |

TABLE 2

|  | Experimental Example | QY (%) | $\lambda^1_{max}$ (nm) | FWHM$^1$ (nm) | Average of FWHM$^2$ (nm) | SD$^1$ of $\lambda^2_{max}$ (nm) | SD$^2$ of FWHM$^2$ (nm) |
|---|---|---|---|---|---|---|---|
| Example | 1 | 88 | 644 | 42 | 27 | 22 | 10 |
|  | 2 | 81 | 611 | 39 | 24 | 21 | 8 |
|  | 3 | 86 | 627 | 39 | 25 | 22 | 8 |
|  | 4 | 94 | 632 | 36 | 25 | 21 | 6 |
|  | 5 | 85 | 633 | 34 | 24 | 20 | 4 |
|  | 6 | 92 | 612 | 32 | 22 | 18 | 5 |
| Comparative | 7 | 55 | 628 | 82 | 35 | 33 | 18 |
| Example | 8 | 30 | 608 | 71 | 36 | 29 | 15 |
|  | 9 | 82 | 633 | 65 | 31 | 27 | 14 |
|  | 10 | 69 | 637 | 51 | 31 | 22 | 10 |
|  | 11 | 78 | 622 | 46 | 29 | 23 | 11 |

In Table 2, "$\lambda^1_{MAX}$" refers to the peak wavelength of the emission spectrum ($\lambda^1$), "FWHM$^1$" refers to the full width at half maximum of the emission spectrum ($\lambda^1$), "average of FWHM$^2$" refers to the average value of the full width at half maximum (FWHM$^2$) of the spectrum ($\lambda^2$), and "SD$^1$ of $\lambda^2_{MAX}$" refers to the standard deviation of the peak wavelength ($\lambda^2_{MAX}$) of the emission spectrum ($\lambda^2$), and "SD$^2$ of FWHM$^2$" refers to the standard deviation of the full width at half maximum (FWHM$^2$) of the emission spectrum ($\lambda^2$).

REFERENCE CHARACTERS LIST

1, 101 Blue LED
3, 103 Liquid Crystal
7, 8 QD Patterning
9 Diffusion Layer
11 Core
12 Shell
102 QD Film
104 Color Filter (R)
105 Color Filter (G)
106 Color Filter (B)

The invention claimed is:

1. A semiconductor nanoparticle aggregate that is an aggregate of core/shell type semiconductor nanoparticles comprising a core comprising In and P and a shell comprising one or more layers, wherein
   a peak wavelength ($\lambda^1_{MAX}$) of an emission spectrum ($\lambda^1$) when the semiconductor nanoparticle aggregate is excited with excitation light of 450 nm in a state where the semiconductor nanoparticle aggregate is dispersed in a dispersion medium is from 605 nm to 655 nm and a full width at half maximum (FWHM$^1$) of the emission spectrum ($\lambda^1$) is 43 nm or less,
   an emission spectrum ($\lambda^2$) from each particle obtained by exciting the semiconductor nanoparticles constituting the semiconductor nanoparticle aggregate with excitation light of 445 nm satisfies all of following requirements (1) to (3):
   (1) an average value of a full width at half maximum (FWHM$^2$) of the emission spectrum ($\lambda^2$) is 28 nm or less,
   (2) a standard deviation (SD$^1$) of a peak wavelength ($\lambda^2_{MAX}$) of the emission spectrum ($\lambda^2$) is 10 nm or more and 30 nm or less, and
   (3) a standard deviation (SD$^2$) of the full width at half maximum (FWHM$^2$) of the emission spectrum ($\lambda^2$) is 12 nm or less.

2. The semiconductor nanoparticle aggregate according to claim 1, wherein the full width at half maximum (FWHM$^1$) is 38 nm or less.

3. The semiconductor nanoparticle aggregate according to claim 1, wherein the average value of the full width at half maximum (FWHM$^2$) is 25 nm or less.

4. The semiconductor nanoparticle aggregate according to claim 1, wherein the standard deviation (SD$^2$) is 7 nm or less.

5. The semiconductor nanoparticle aggregate according to claim 1, wherein
   the full width at half maximum (FWHM$^1$) is 35 nm or less,
   the average value of the full width at half maximum (FWHM$^2$) is 24 nm or less, and
   the standard deviation (SD$^2$) is 6 nm or less.

6. The semiconductor nanoparticle aggregate according to claim 1, wherein a quantum yield (QY) of the semiconductor nanoparticle aggregate is 80% or more.

7. The semiconductor nanoparticle aggregate according to claim 6, wherein the quantum yield (QY) of the semiconductor nanoparticle aggregate is 85% or more.

8. The semiconductor nanoparticle aggregate according to claim 7, wherein the quantum yield (QY) of the semiconductor nanoparticle aggregate is 90% or more.

9. The semiconductor nanoparticle aggregate according to claim 1, wherein
    the semiconductor nanoparticles comprise at least In, P, Zn, Se, and halogen, and
    in the semiconductor nanoparticles, molar ratios of P, Zn, Se, and halogen relative to In in terms of atoms are P: 0.20 to 0.95, Zn: 11.00 to 50.00, Se: 7.00 to 25.00, and halogen: 0.80 to 15.00.

10. A semiconductor nanoparticle aggregate dispersion liquid, comprising
    the semiconductor nanoparticle aggregate as claimed in claim 1 dispersed in an organic dispersion medium.

11. A semiconductor nanoparticle aggregate composition, comprising
    the semiconductor nanoparticle aggregate as claimed in claim 1 dispersed in a monomer or a prepolymer.

12. A semiconductor nanoparticle aggregate cured film, comprising
    the semiconductor nanoparticle aggregate as claimed in claim 1 dispersed in a macromolecule matrix.

* * * * *